US008907326B2

(12) United States Patent
Lee et al.

(10) Patent No.: US 8,907,326 B2
(45) Date of Patent: Dec. 9, 2014

(54) ORGANIC LIGHT-EMITTING DISPLAY DEVICE AND THIN FILM DEPOSITION APPARATUS FOR MANUFACTURING THE SAME

(75) Inventors: Jung-Min Lee, Yongin (KR); Choong-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1151 days.

(21) Appl. No.: 12/814,816

(22) Filed: Jun. 14, 2010

(65) Prior Publication Data

US 2010/0328197 A1 Dec. 30, 2010

(30) Foreign Application Priority Data

Jun. 24, 2009 (KR) .................. 10-2009-0056530

(51) Int. Cl.
| H01L 29/08 | (2006.01) |
| C23C 14/04 | (2006.01) |
| C23C 14/24 | (2006.01) |
| H01L 51/00 | (2006.01) |
| H01L 27/32 | (2006.01) |
| H01L 51/56 | (2006.01) |

(52) U.S. Cl.
CPC ......... *H01L 51/0011* (2013.01); *H01L 27/3244* (2013.01); *C23C 14/044* (2013.01); *C23C 14/243* (2013.01); *C23C 14/042* (2013.01); H01L 51/56 (2013.01)
USPC .................. 257/40; 257/72; 257/E51.018

(58) Field of Classification Search
CPC .. C23C 14/042; C23C 14/044; C23C 14/243; H01L 51/0011
USPC ....................... 257/40, 72, E51.018
See application file for complete search history.

(56) References Cited

U.S. PATENT DOCUMENTS 6,274,198 B1 8/2001 Dautartas
6,371,451 B1 4/2002 Choi
(Continued)

FOREIGN PATENT DOCUMENTS

EP 1 413 644 4/2004
EP 1 518 940 3/2005
(Continued)

OTHER PUBLICATIONS

KIPO Registration Determination Certificate dated Nov. 30, 2011, for Korean priority Patent application 10-2009-0056530, 5 pages.

(Continued)

*Primary Examiner* — Jose R Diaz
(74) *Attorney, Agent, or Firm* — Christie, Parker & Hale, LLP (57) ABSTRACT

A thin film deposition apparatus that can be used to manufacture large substrates on a mass scale and that improves manufacturing yield, and an organic light-emitting display device manufactured using the thin film deposition apparatus. The organic light-emitting display device includes: a substrate including a plurality of sub-deposition areas arranged parallel to each other; at least one thin film transistor formed on the substrate, the at least one thin film transistor comprising a semiconductor active layer, a gate electrode insulated from the semiconductor active layer, and source and drain electrodes contacting the semiconductor active layer; a plurality of pixel electrodes formed on the thin film transistor; a plurality of organic layers formed on each of the pixel electrodes; and a counter electrode formed on the organic layers, wherein the plurality of organic layers lie in each of the sub-deposition areas and have a larger shadow zone the further a distance from a center of the corresponding deposition area.

6 Claims, 9 Drawing Sheets

(56) References Cited

U.S. PATENT DOCUMENTS

| | | |
|---|---|---|
| 6,749,906 B2 | 6/2004 | Van Slyke |
| 7,282,855 B2 * | 10/2007 | Park et al. .................. 313/506 |
| 2001/0006827 A1 | 7/2001 | Yamazaki et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2006/0144325 A1 | 7/2006 | Jung et al. |
| 2006/0174829 A1 | 8/2006 | An et al. |
| 2006/0205101 A1 | 9/2006 | Lee et al. |
| 2007/0077358 A1 | 4/2007 | Jeong et al. |
| 2007/0178708 A1 | 8/2007 | Ukigaya |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0251785 A1 | 10/2008 | Noh et al. |
| 2009/0017192 A1 | 1/2009 | Matsuura |
| 2009/0170230 A1 * | 7/2009 | Kidu et al. .................. 438/35 |
| 2009/0232976 A1 | 9/2009 | Yoon et al. |

FOREIGN PATENT DOCUMENTS

| | | |
|---|---|---|
| JP | 4-272170 | 9/1992 |
| JP | 2000-68054 | 3/2000 |
| JP | 2001-52862 | 2/2001 |
| JP | 2001-93667 | 4/2001 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-103269 | 4/2004 |
| JP | 2004-103341 | 4/2004 |
| JP | 2004-199919 | 7/2004 |
| JP | 2005-44592 | 2/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-47293 | 2/2007 |
| JP | 2008-121098 | 5/2008 |
| JP | 2009-19243 | 1/2009 |
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-0405080 | 10/2003 |
| KR | 10-2003-0091947 | 12/2003 |
| KR | 10-2003-0093959 | 12/2003 |
| KR | 10-2004-0050045 | 6/2004 |
| KR | 10-2004-0069281 | 8/2004 |
| KR | 10-2004-0084747 | 10/2004 |
| KR | 10-0463212 | 12/2004 |
| KR | 10-0483487 B1 | 4/2005 |
| KR | 10-0520159 | 9/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0104675 | 10/2006 |
| KR | 10-2006-0104677 | 10/2006 |
| KR | 10-2006-0109627 | 10/2006 |
| KR | 10-0635903 B1 | 10/2006 |
| KR | 10-0646160 | 11/2006 |
| KR | 10-0687007 | 2/2007 |
| KR | 10-2007-0025164 | 3/2007 |
| KR | 10-0696547 | 3/2007 |
| KR | 10-0697663 BI | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 10-2008-0001184 | 1/2008 |
| KR | 10-0797787 | 1/2008 |
| KR | 10-0800125 | 1/2008 |
| KR | 10-0815265 | 3/2008 |
| KR | 10-0823508 | 4/2008 |
| KR | 10-0827760 | 4/2008 |
| KR | 10-0839380 | 6/2008 |
| KR | 10-2008-0060400 | 7/2008 |
| KR | 10-2008-0061132 | 7/2008 |
| KR | 10-2008-0062212 | 7/2008 |
| KR | 10-2009-0038733 | 4/2009 |
| KR | 10-2009-0097453 | 9/2009 |

OTHER PUBLICATIONS

English-language abstract of Korean Publication No. KR 10-2002-0034272.

English-language abstract of Korean Publication No. KR 10-2002-0056238.

English-language abstract of Korean Publication No. KR 10-2002-0088662.

English-language abstract of Korean Publication No. KR 10-2005-0045619.

English-language abstract of Korean Publication No. KR 10-2006-0126267.

English-language abstract of Korean Publication No. KR 10-2008-0038650.

U.S. Appl. No. 12/784,774, filed May 21, 2010, Choong-Ho Lee et al., Samsung Mobile Display Co., Ltd.

U.S. Appl. No. 13/014,225, filed Jan. 26, 2011, Jong-Won Hong et al., Samsung Mobile Display Co., Ltd.

U.S. Appl. No. 12/797,858, filed Jun. 10, 2010, Choong-Ho Lee et al., Samsung Mobile Display Co., Ltd.

U.S. Appl. No. 12/836,760, filed Jul. 15, 2010, Jong-Heon Kim, et al., Samsung Mobile Display Co., Ltd.

U.S. Appl. No. 12/784,804, filed May 21, 2010, Choong-Ho Lee, et al., Samsung Mobile Display Co., Ltd.

U.S. Appl. No. 12/849,193, filed Aug. 3, 2010, Ji-Sook Oh et al., Samsung Mobile Display Co., Ltd.

U.S. Appl. No. 12/979,193, filed Dec. 28, 2010, Hyun Sook Park et al., Samsung Mobile Display Co., Ltd.

U.S. Appl. No. 12/820,355, filed Jun. 22, 2010, Yong-Sup Choi et al., Samsung Mobile Display Co., Ltd.

U.S. Appl. No. 12/950,361, filed Nov. 19, 2010, Choong-Ho Lee et al., Samsung Mobile Display Co., Ltd.

U.S. Appl. No. 12/795,896, filed Jun. 8, 2010, Jung-Min Lee, et al., Samsung Mobile Display Co., Ltd.

U.S. Appl. No. 12/856,942, filed Aug. 16, 2010, Yun-Mi Lee et al., Samsung Mobile Display Co., Ltd.

(56) References Cited

OTHER PUBLICATIONS

U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Appl. No. 13/031,756, filed Feb. 22, 2011, Yong Sup Choi et al., Samsung Mobile Display Co., Ltd.
Office action for Chinese Patent Application No. 201010216896.9, dated Dec. 17, 2013, 6 pages.

\* cited by examiner

ORGANIC LIGHT-EMITTING DISPLAY DEVICE AND THIN FILM DEPOSITION APPARATUS FOR MANUFACTURING THE SAME

CROSS-REFERENCE TO RELATED APPLICATION

This application claims the benefit of Korean Patent Application No. 10-2009-0056530, filed on Jun. 24, 2009, in the Korean Intellectual Property Office, the disclosure of which is incorporated herein by reference.

BACKGROUND

1. Field

An aspect of the present invention relates to an organic light-emitting display device and a thin film deposition apparatus for manufacturing the same, and more particularly, to an apparatus for depositing a thin film on a substrate, and an organic light-emitting display device manufactured by using the thin film deposition apparatus.

2. Description of the Related Art

Organic light-emitting display devices have a larger viewing angle, better contrast characteristics, and a faster response rate than other display devices, and thus have drawn attention as a next-generation display device.

In general, organic light-emitting display devices have a stacked structure including an anode, a cathode, and an emission layer interposed between the anode and the cathode, and display images in color when holes and electrons, injected respectively from the anode and the cathode, recombine in the emission layer and thus emit light. However, it is difficult to achieve high light-emission efficiency with such a structure, and thus intermediate layers, including an electron injection layer, an electron transport layer, a hole transport layer, a hole injection layer, and the like, are optionally additionally interposed between the emission layer and each of the electrodes.

In other words, an organic light-emitting display device includes intermediate layers, including an emission layer disposed between a first electrode and a second electrode that are arranged opposite to each other. The electrodes and the intermediate layers may be formed by using various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY

An aspect of the present invention provides a thin film deposition apparatus that may be easily manufactured, that may be simply used to manufacture large substrates on a mass scale, that improves manufacturing yield and deposition efficiency, and that allows deposited materials to be reused, and an organic light-emitting display device manufactured by using the thin film deposition apparatus.

According to an aspect of the present invention, there is provided an organic light-emitting display device including: a substrate including a plurality of deposition areas arranged parallel to each other; at least one thin film transistor formed on the substrate, the at least one thin film transistor including a semiconductor active layer, a gate electrode insulated from the semiconductor active layer, and source and drain electrodes contacting the semiconductor active layer; a plurality of pixel electrodes formed on the thin film transistor; a plurality of organic layers formed on each of the pixel electrodes; and a counter electrode formed on the organic layers, wherein the plurality of organic layers lie in each of the deposition areas and have a larger shadow zone the further the distance from a center of the corresponding deposition area.

Each of the organic layers may include a left-side shadow zone and a right-side shadow zone, and whichever of the left-side shadow zone and the right-side shadow zone is positioned further away from the center of the corresponding deposition area may be larger than the other one.

Whichever of the left-side shadow zone and the right-side shadow zone of each of the organic layers is further away from the center of the corresponding deposition area may be larger.

The left-side shadow zone and the right-side shadow zone of one of the organic layers, the organic layer formed at the center of each of the deposition areas, may be substantially the same in size.

One of the organic layers, the organic layer formed at the center of each of the deposition areas, may have the smallest shadow zone among the other organic layers in the corresponding deposition area.

The plurality of organic layers in each of the deposition areas may be symmetrical with respect to the center of the corresponding deposition area.

The plurality of organic layers formed in each of the deposition areas may have the same pattern.

According to an aspect of the present invention, there is provided a thin film deposition apparatus for forming a thin film on a substrate, the apparatus including: a deposition source that discharges a deposition material; a first nozzle that is disposed at a side of the deposition source and includes a plurality of first slits arranged in a first direction; a second nozzle that is disposed opposite to the first nozzle and includes a plurality of second slits arranged in the first direction; and a barrier wall assembly that is disposed between the first nozzle and the second nozzle in the first direction, and includes a plurality of barrier walls that partition a space between the first nozzle and the second nozzle into a plurality of sub-deposition spaces, wherein the deposition source, the first nozzle, the second nozzle, and the barrier wall assembly are movable relative to the substrate, or the substrate is movable relative to the deposition source, the first nozzle, the second nozzle, and the barrier wall assembly.

A plurality of thin films may lie within each of the sub-deposition spaces and may have a larger shadow zone the further the distance from a center of the corresponding sub-deposition space.

Each of the thin films formed on the substrate may include a left-side shadow zone and a right-side shadow zone, and whichever of the left-side shadow zone and the right-side shadow zone is further away from the center of the corresponding sub-deposition space may be larger than the other one.

Whichever of the left-side shadow zone and the right-side shadow zone of each of the thin films is further away from the center of the corresponding sub-deposition space may be larger.

One of the thin films, and in particular, the thin film formed at the center of each of the sub-deposition spaces, may include a left-side shadow zone and a right-side shadow zone that are substantially the same in size.

One of the thin films, the thin film formed at the center of each of the sub-deposition spaces, may have the smallest shadow zone among the other thin films in the corresponding sub-deposition space.

The plurality of thin films formed within each of the deposition spaces may be symmetrical with respect to the center of the corresponding deposition space.

Each of the barrier walls may extend in a second direction that is substantially perpendicular to the first direction, in order to partition the space between the first nozzle and the second nozzle into the plurality of deposition spaces.

The plurality of barrier walls may be arranged at equal intervals.

The barrier walls may be separated from the second nozzle by a predetermined distance.

The barrier wall assembly is detachable from the thin film deposition apparatus.

The barrier wall assembly may include a first barrier wall assembly including a plurality of first barrier walls, and a second barrier wall assembly including a plurality of second barrier walls.

Each of the first barrier walls and each of the second barrier walls may extend in a second direction that is substantially perpendicular to the first direction, in order to partition the space between the first nozzle and the second nozzle into the plurality of deposition spaces.

The first barrier walls may be arranged to respectively correspond to the second barrier walls.

Each pair of the first and second barrier walls corresponding to each other may be arranged on substantially the same plane. The second nozzle may be separated from the substrate by a predetermined distance.

The deposition material may be deposited on the substrate while the deposition source, the first nozzle, the second nozzle, and the barrier wall assembly are moved relative to the substrate or while the substrate is moved relative to the deposition source, the first nozzle, the second nozzle, and the barrier wall assembly.

The deposition source, the first nozzle, the second nozzle, and the barrier wall assembly may be moved relative to the substrate along a plane parallel to a surface of the substrate, or the substrate may be moved relative to the deposition source, the first nozzle, the second nozzle, and the barrier wall assembly along the plane.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

Figure 1:
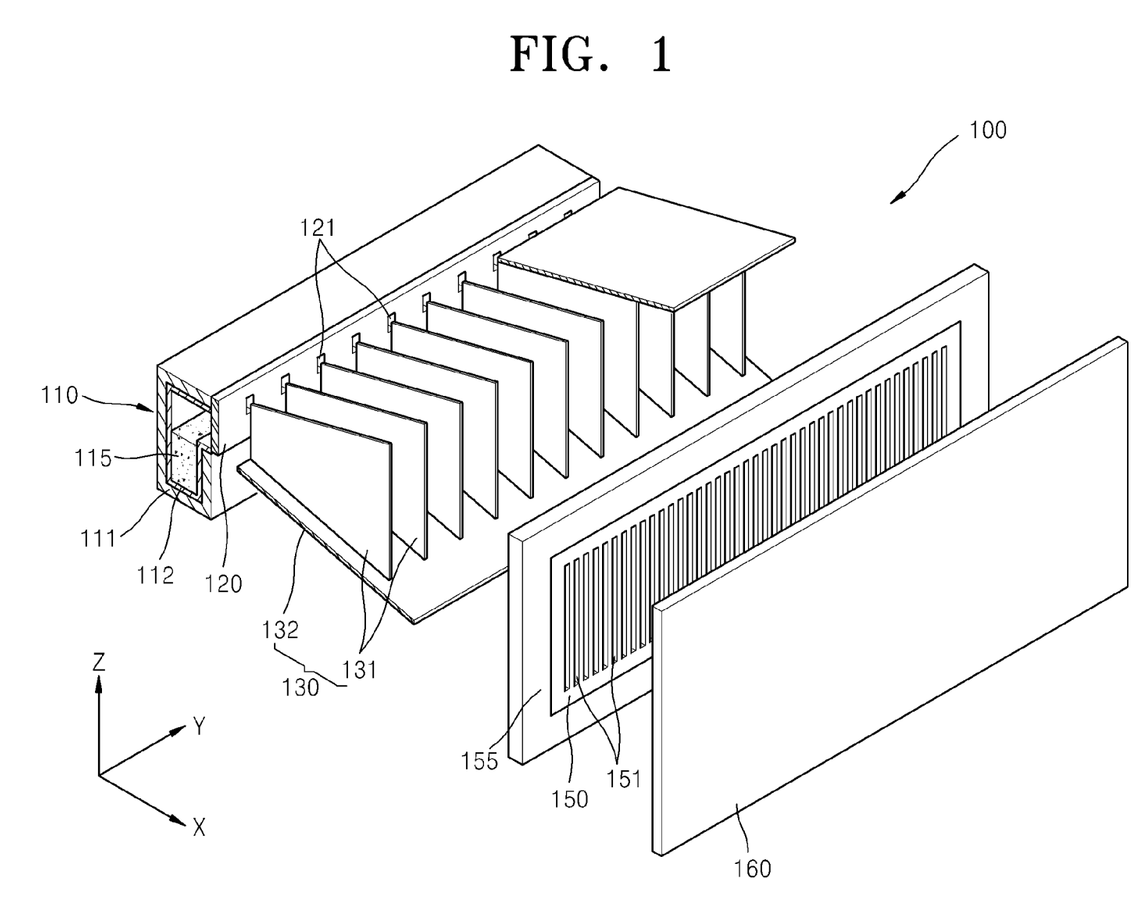
FIG. 1 is a schematic perspective view of a thin film deposition apparatus according to an embodiment of the present invention.
Figure 2:
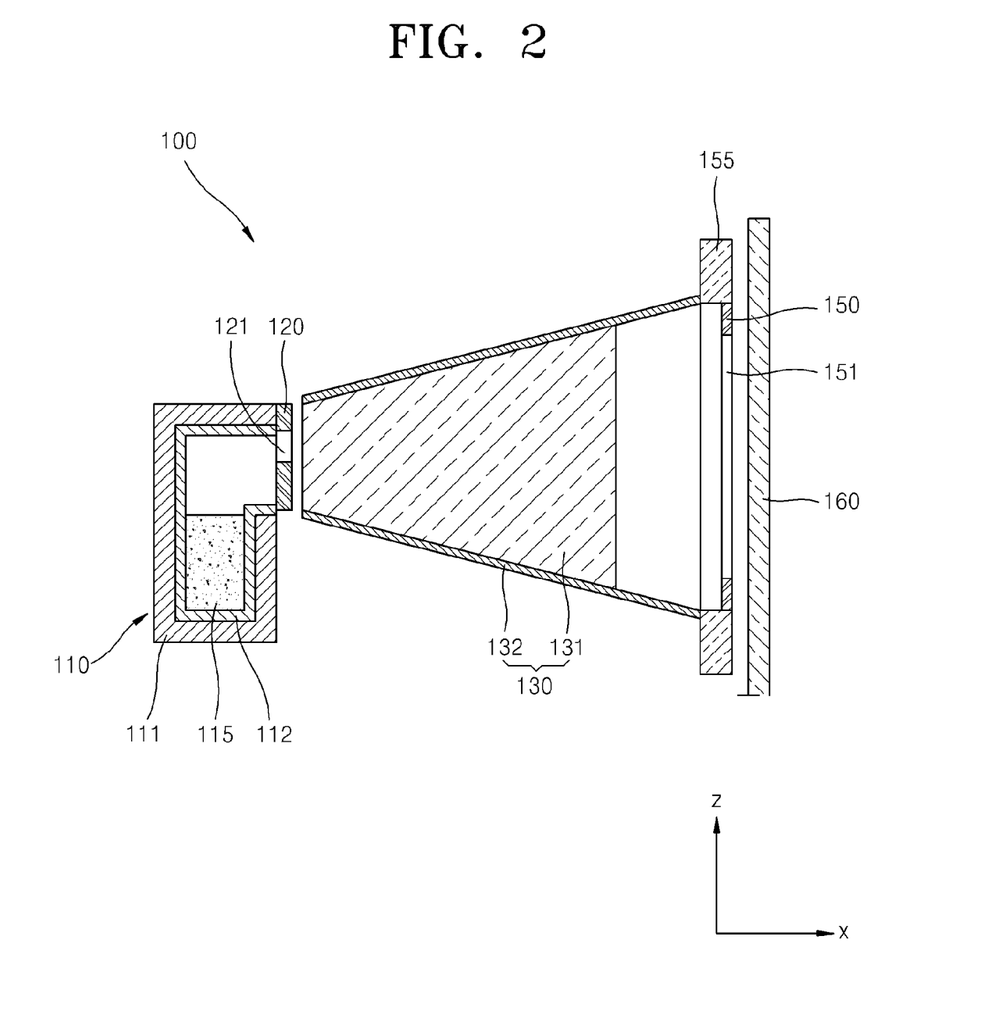
FIG. 2 is a schematic side view of the thin film deposition apparatus of FIG. 1, according to an embodiment of the present invention.
Figure 3:
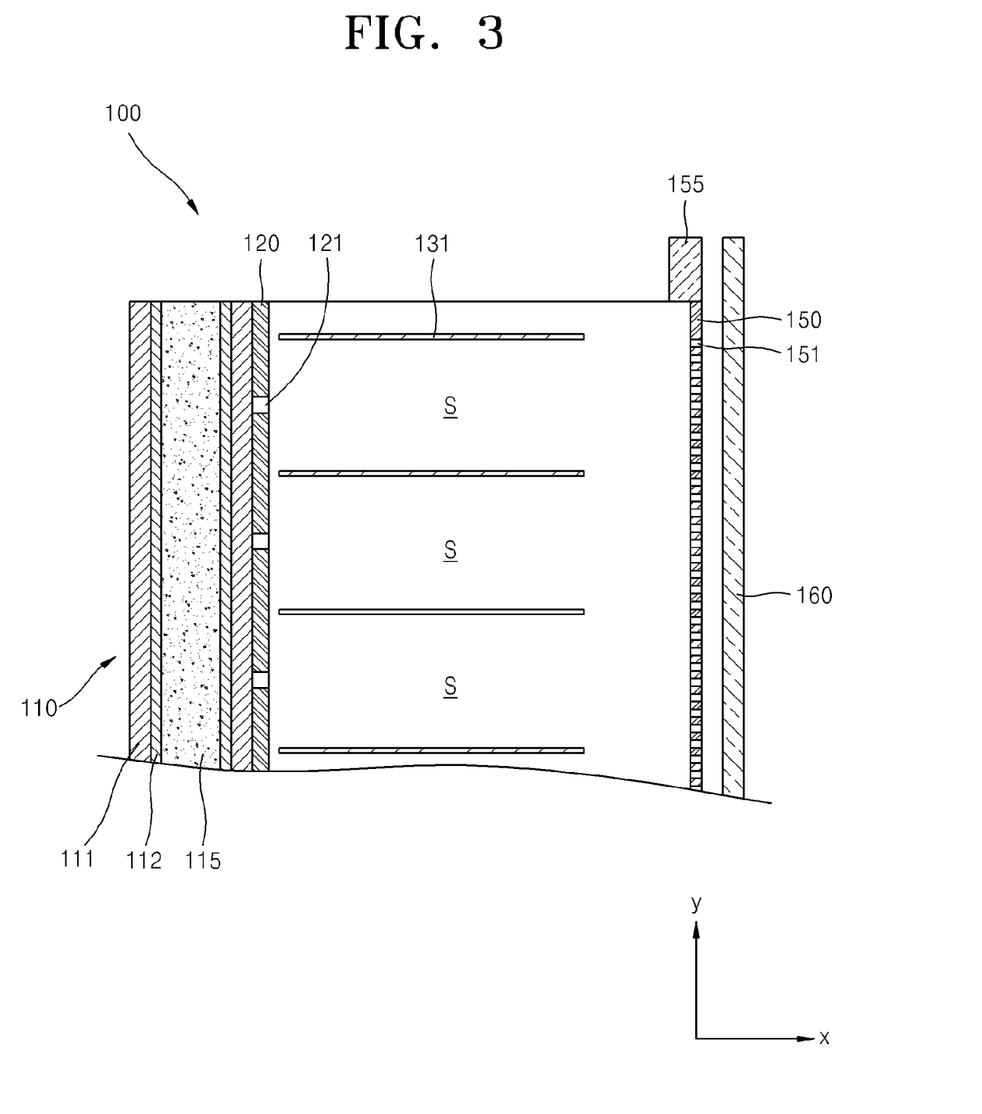
FIG. 3 is a schematic plan view of the thin film deposition apparatus of FIG. 1, according to an embodiment of the present invention.

FIG. 1 is a schematic perspective view of a thin film deposition apparatus 100 according to an embodiment of the present invention, FIG. 2 is a schematic side view of the thin film deposition apparatus 100, and FIG. 3 is a schematic plan view of the thin film deposition apparatus 100.

Referring to FIGS. 1, 2 and 3, the thin film deposition apparatus 100 according to an embodiment of the present invention includes a deposition source 110, a first nozzle 120, a barrier wall assembly 130, a second nozzle 150, and a substrate 160.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a straight direction.

In particular, in order to deposit a deposition material 115 that is discharged from the deposition source 110 through the first nozzle 120 and the second nozzle 150, on a substrate in a desired pattern, it is required to maintain the chamber in a high-vacuum state as in a deposition method using a fine metal mask (FMM). In addition, the temperatures of the barrier wall assembly 130, and the second nozzle 150 have to be sufficiently lower than the temperature of the deposition source 110. In this regard, the temperatures of the barrier wall assembly 130 and the second nozzle 150 may be about 100° C. or less. This is so the deposition material 115 that has collided against the barrier wall assembly 130 is not re-vaporized. In addition, thermal expansion of the second nozzle 150 may be minimized when the temperature of the second nozzle 150 is sufficiently low. The barrier wall assembly 130 faces the deposition source 110 which is at a high temperature. In addition, the temperature of a portion of the first barrier wall assembly 130 close to the deposition source 110 rises by a maximum of about 167° C., and thus a partial-cooling apparatus may be further included if needed. To this end, the barrier wall assembly 130 may include a cooling member.

The substrate 160, which constitutes a target on which the deposition material 115 is to be deposited, is disposed in the chamber. The substrate 160 may be a substrate for flat panel displays. A large substrate, such as a mother glass, for manufacturing a plurality of flat panel displays, may be used as the substrate 160.

The deposition source 110 that contains and heats the deposition material 115 is disposed in an opposite side of the chamber to that in which the substrate 160 is disposed. As the deposition material 115 contained in the deposition source 110 is vaporized, the deposition material 115 is deposited on the substrate 160. In particular, the deposition source 110 includes a crucible 111 that is filled with the deposition material 115, and a heater 112 that heats the crucible 111 to vaporize the deposition material 115, which is contained in the crucible 111, towards a side of the crucible 111, and in particular, towards the first nozzle 120.

The first nozzle 120 is disposed at a side of the deposition source 110, and in particular, at the side of the deposition source 110 facing the substrate 160. The first nozzle 120 includes a plurality of first slits 121 arranged at equal intervals in a Y-axis direction. The deposition material 115 that is vaporized in the deposition source 110 passes through the first nozzle 120 towards the substrate 160.

The barrier wall assembly 130 is disposed at a side of the first nozzle 120. The barrier wall assembly 130 includes a plurality of barrier walls 131, and a barrier wall frame 132 that surrounds sides of the barrier walls 131. The plurality of barrier walls 131 may be arranged parallel to each other at equal intervals in the Y-axis direction. In addition, each of the barrier walls 131 may be arranged parallel to an XZ plane in FIG. 1, i.e., perpendicular to the Y-axis direction. The plurality of barrier walls 131 arranged as described above partition the space between the first nozzle 120 and the second nozzle 150, which is to be described later, into a plurality of sub-deposition spaces S. In the thin film deposition apparatus 100, the deposition space is divided by the barrier walls 131 into the sub-deposition spaces S that respectively correspond to the first slits 121 through which the deposition material 115 is discharged.

The barrier walls 131 may be respectively disposed between adjacent first slits 121. In other words, each of the first slits 121 may be disposed between two corresponding adjacent barrier walls 131. The first slits 121 may be respectively located at the midpoint between two adjacent barrier walls 131. As described above, since the barrier walls 131 partition the space between the first nozzle 120 and the second nozzle 150, which will be described later, into the plurality of sub-deposition spaces S, the deposition material 115 discharged through each of the first slits 121 is not mixed with the deposition material 115 discharged through the other first slits 121, and passes through second slits 151 so as to be deposited on the substrate 160. In other words, the barrier walls 131 guide the deposition material 115, which is discharged through the first slits 121, not to flow in the Y-axis direction.

The barrier wall frame 132, which forms upper and lower sides of the barrier walls 131, retain the positions of the barrier walls 131, and guides the deposition material 115, which is discharged through the first slits 121, not to flow in a Z-axis direction.

In addition, the barrier wall assembly 130 may be constructed to be detachable from the thin film deposition apparatus 100. A conventional FMM deposition method has low deposition efficiency. Herein, deposition efficiency refers to the ratio of the amount of deposition material deposited on a substrate to the amount of deposition material vaporized from a deposition source. The conventional FMM deposition method has a deposition efficiency of about 32%. Furthermore, in the conventional FMM deposition method, about 68% of organic deposition material, which has not been deposited on the substrate, remains adhered to a deposition apparatus, and thus it is not straightforward to reuse the deposition material.

In order to overcome these and/or other problems, in the thin film deposition apparatus 100, the deposition space is enclosed by using the barrier wall assembly 130, so that the deposition material 115 that is not deposited on the substrate is mostly deposited within the barrier wall assembly 130. Thus, when a large amount of the deposition material 115 lies in the barrier wall assembly 130 after a long deposition process, the barrier wall assembly 130 may be detached from the thin film deposition apparatus 100 and then placed in a separate deposition material recycling apparatus to recover the deposition material 115. Due to the structure of the thin film deposition apparatus 100 according to an embodiment of the present invention, a reuse rate of the deposition material 115 is increased, so that the deposition efficiency is improved, and thus the manufacturing costs are reduced.

The second nozzle 150 and the second nozzle frame 155 are disposed between the deposition source 110 and the substrate 160. The second nozzle frame 155 may be formed in a lattice shape, similar to a window frame. The second nozzle 150 is bound inside the second nozzle frame 155. The second nozzle 150 includes a plurality of second slits 151 arranged at equal intervals in the Y-axis direction. The deposition material 115 that is vaporized in the deposition source 110, passes through the first nozzle 120 and the second nozzle 150 towards the substrate 160.

In the thin film deposition apparatus 100, the total number of second slits 151 may be greater than the total number of first slits 121. In addition, there may be a greater number of second slits 151 than first slits 121 disposed between two adjacent barrier walls 131.

In other words, at least one first slit 121 may be disposed between each two adjacent barrier walls 131. Meanwhile, a plurality of second slits 151 may be disposed between each two adjacent barrier walls 131. The space between the first nozzle 120 and the second nozzle 150 is partitioned by the barrier walls 131 into sub-deposition spaces S that correspond to the first slits 121, respectively. Thus, the deposition material 115 discharged from each of the first slits 121 passes through a plurality of second slits 151 disposed in the sub-deposition space S corresponding to the first slit 121, and is then deposited on the substrate 160.

The second nozzle 150 may be manufactured by etching, which is the same method as used in a conventional method of manufacturing an FMM, and in particular, a striped FMM. In the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern. However, in the thin film deposition apparatus 100, a thin film is deposited while the thin film deposition apparatus 100 is moved in the Z-axis direction within the chamber (not shown). In other words, once the thin film deposition apparatus 100 has completed deposition at a current location, either the thin film deposition apparatus 100 or the substrate 160 is moved relative to each other in the Z-axis direction for further continuous deposition. Thus, in the thin film deposition apparatus 100 according to an embodiment of the present invention, the second nozzle 150 may be significantly smaller than an FMM used in a conventional deposition method. In other words, in the thin film deposition apparatus 100, the length of the second nozzle 150 in the Z-axis direction may be less than the length of the substrate 160 in the Z-axis direction, provided that the width of the second nozzle 150 in the Y-axis direction is equal to the width of the substrate 160 in the Y-axis direction. As described above, since the second nozzle 150 may be formed to be significantly smaller than an FMM used in a conventional deposition method, it is relatively easy to manufacture the second nozzle 150 used in the embodiments of the present invention. In other words, using the second nozzle 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

The barrier wall assembly 130 and the second nozzle 150 are separated from each other by a predetermined distance. The barrier wall assembly 130 and the second nozzle 150 are separated from each other for at least some of the following reasons and/or others.

First, the second nozzle 150 and the second nozzle frame 155 have to be aligned with the substrate 160 to be accurate in position and to have a constant interval therebetween, and thus require high-precision control. Thus, in order to make it easy to control such parts that require high-precision control, the second nozzle 150 and the second nozzle frame 155 are separated from the deposition source 110, the first nozzle 120 and the barrier wall assembly 130, which are relatively heavy parts not requiring precise control. The temperature of the barrier wall assembly 130 may increase to 100° C. or higher due to the deposition source 110 whose temperature is high. Thus, in order to prevent the heat of the barrier wall assembly 130 from being conducted to the second nozzle 150, the barrier wall assembly 130 and the second nozzle 150 are separated from each other. In the thin film deposition apparatus 100 according to an embodiment of the present invention, the deposition material 115 adhered to the barrier wall assembly 130 is mostly reused, whereas the deposition material 115 adhered to the second nozzle 150 may not be reused. Thus, when the barrier wall assembly 130 is separated from the second nozzle 150, it may be straightforward to recover the deposition material 115 to be reused. In addition, a calibration plate (not shown) may be further installed in order to ensure uniformity of a thin film over the entire substrate 160. When the barrier walls 131 are separated from the second nozzle 150, it is very easy to install the calibration plate. Finally, a partition (not shown) may be further installed between the barrier walls 131 and the second nozzle 150 in order to prevent deposition of the deposition material 115 on the second nozzle 150 after deposition onto the substrate 160 has been completed and before another target is subjected to deposition. This may extend a nozzle exchange cycle. It is easy to install the partition between the barrier walls 131 and the second nozzle 150.

Figure 4A:
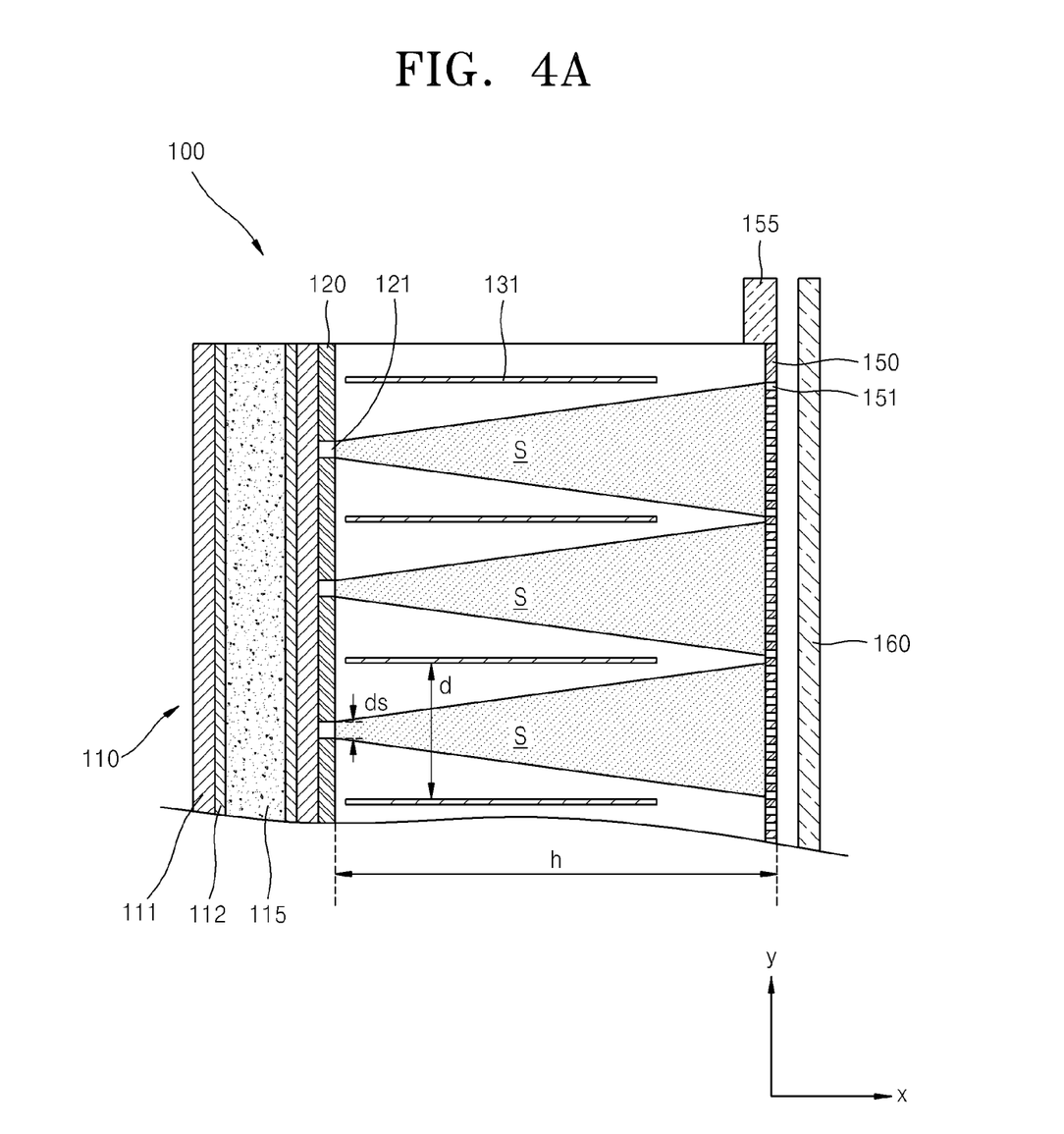
FIG. 4A is a schematic plan view for describing deposition of a deposition material in the thin film deposition apparatus of FIG. 1, according to an embodiment of the present invention.
Figure 4B:
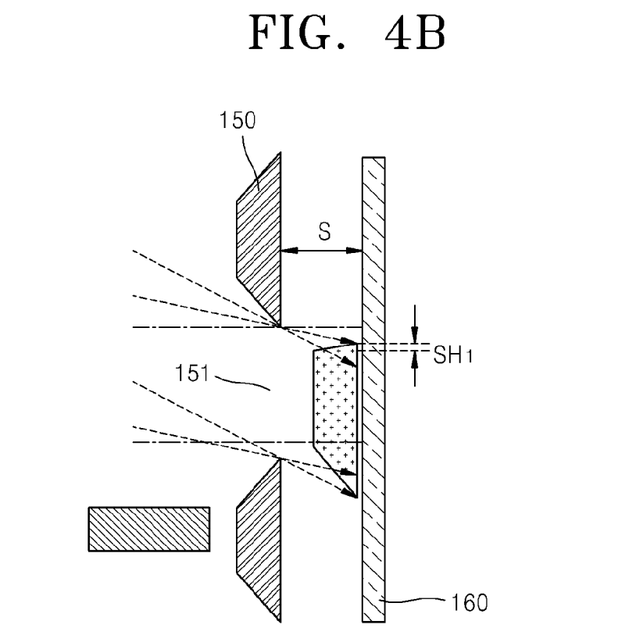
FIG. 4B illustrates a shadow zone of a thin film deposited on a substrate when a deposition space is partitioned by barrier walls, as illustrated in FIG. 4A.
Figure 4C:
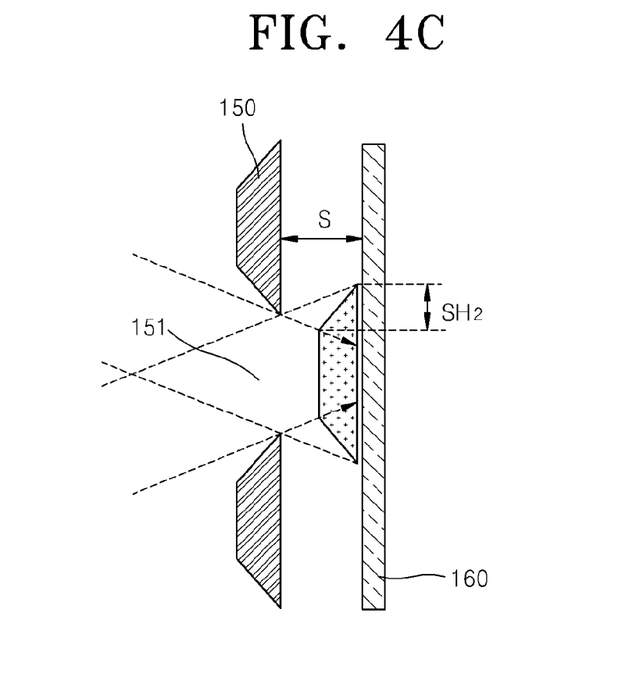
FIG. 4C illustrates a shadow zone of a thin film deposited on the substrate when the deposition space is not partitioned by barrier walls.

FIG. 4A is a schematic view illustrating deposition of the deposition material 115 in the thin film deposition apparatus 100, according to an embodiment of the present invention. FIG. 4B illustrates a shadow zone of a thin film deposited on the substrate 160 when the deposition space is partitioned by the barrier walls 131. FIG. 4C illustrates a shadow zone of a thin film deposited on the substrate 160 when the deposition space is not partitioned by the barrier walls 131.

Referring to FIG. 4A, the deposition material 115 that is vaporized in the deposition source 110 is deposited on the substrate 160 by being discharged through the first nozzle 120 and the second nozzle 150. Since the space between the first nozzle 120 and the second nozzle 150 is partitioned into a plurality of sub-deposition spaces S by the barrier walls 131, the deposition material 115 discharged through each of the first slits 121 of the first nozzle 120 is not mixed with the deposition material 115 discharged through the other adjacent first slits 121 due to the barrier walls 131.

When the space between the first nozzle 120 and the second nozzle 150 is partitioned by the barrier wall assembly 130, as illustrated in FIGS. 4A and 4B, a width $SH_1$ of a shadow zone formed on the substrate 160 may be determined using Equation 1 below.

$$SH_1 = s*d_s/h \qquad \text{[Equation 1]}$$

where s denotes a distance between the second nozzle 150 and the substrate 160, d denotes a width of the first slits 121 close to the deposition source 110, and h denotes a distance between the deposition source 110 and the second nozzle 150.

However, when the space between the first nozzle 120 and the second nozzle 150 is not partitioned by the barrier walls 131, as illustrated in FIG. 4C, the deposition material 115 is discharged through the second nozzle 150 in a wider range of angles than in the case of FIG. 4B. This is because the deposition material 115 discharged not just through a first slit 121 directly facing a second slit 151 but also through first slits 121 other than the first slit 121 above, passes through the second slit 151 above and is then deposited on the substrate 160. Thus, a width $SH_2$ of a shadow zone formed on the substrate 160 is much greater than when the deposition space is partitioned by the barrier walls 131. The width $SH_2$ of the shadow zone formed on the substrate 160 is determined using Equation 2.

$$SH_2 = s*2d/h \qquad \text{[Equation 2]}$$

where s denotes a distance between the second nozzle 150 and the substrate 160, d denotes a distance between adjacent barrier walls 131, and h denotes a distance between the deposition source 110 and the second nozzle 150.

Referring to Equations 1 and 2, $d_s$, which is the width of the first slits 121, is a few to tens times smaller than d, which is the interval between the adjacent barrier walls, and thus the shadow zone may have a smaller width when the space between the first nozzle 120 and the second nozzle 150 is partitioned by the barrier walls 131. The width $SH_2$ of the shadow zone formed on the substrate 160 may be reduced by either one of the following: (1) by reducing the distance d between the adjacent barrier walls 131, (2) by reducing the distance s between the second nozzle 150 and the substrate 160, or (3) by increasing the distance h between the deposition source 110 and the second nozzle 150.

As described above, the shadow zone formed on the substrate 160 may be reduced by installing the barrier walls 131. Thus, the second nozzle 150 can be separated from the substrate 160.

Thus, in the thin film deposition apparatus 100 according to an embodiment of the present invention, the second nozzle 150 may be separated from the substrate 160 by a predetermined distance. In other words, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this and/or other problems, in the thin film deposition apparatus 100, the second nozzle 150 is disposed to be separated from the substrate 160 by a predetermined distance. This may be facilitated by installing the barrier walls 131 to reduce the width of the shadow zone formed on the substrate 160.

As described above, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. Furthermore, since it is unnecessary to use the FMM in close contact with the substrate during a deposition process, the manufacturing speed may be improved.

Hereinafter, a structure of an organic layer formed by the thin film deposition apparatus 100 will be described in detail.

Figure 5A:
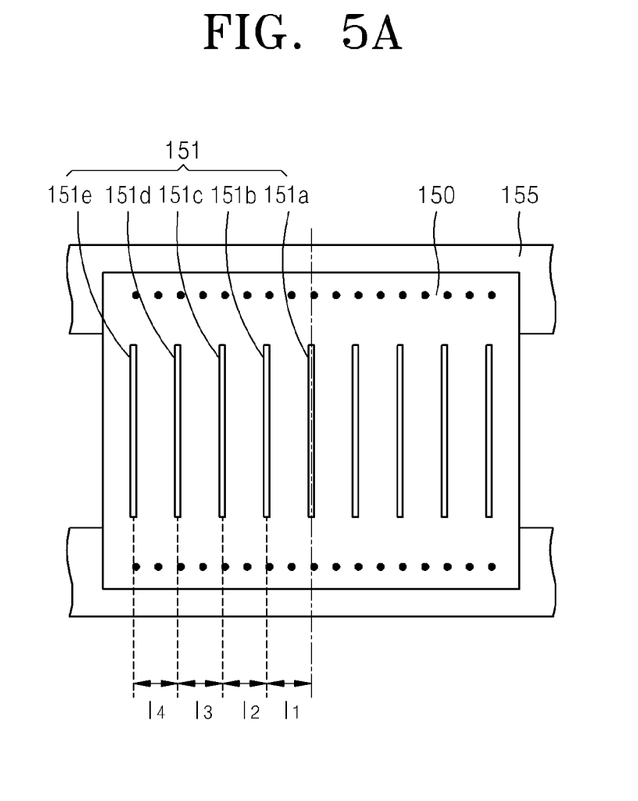
FIG. 5A illustrates second slits of a second nozzle in the thin film deposition apparatus of FIG. 1 arranged at equal intervals.
Figure 5B:
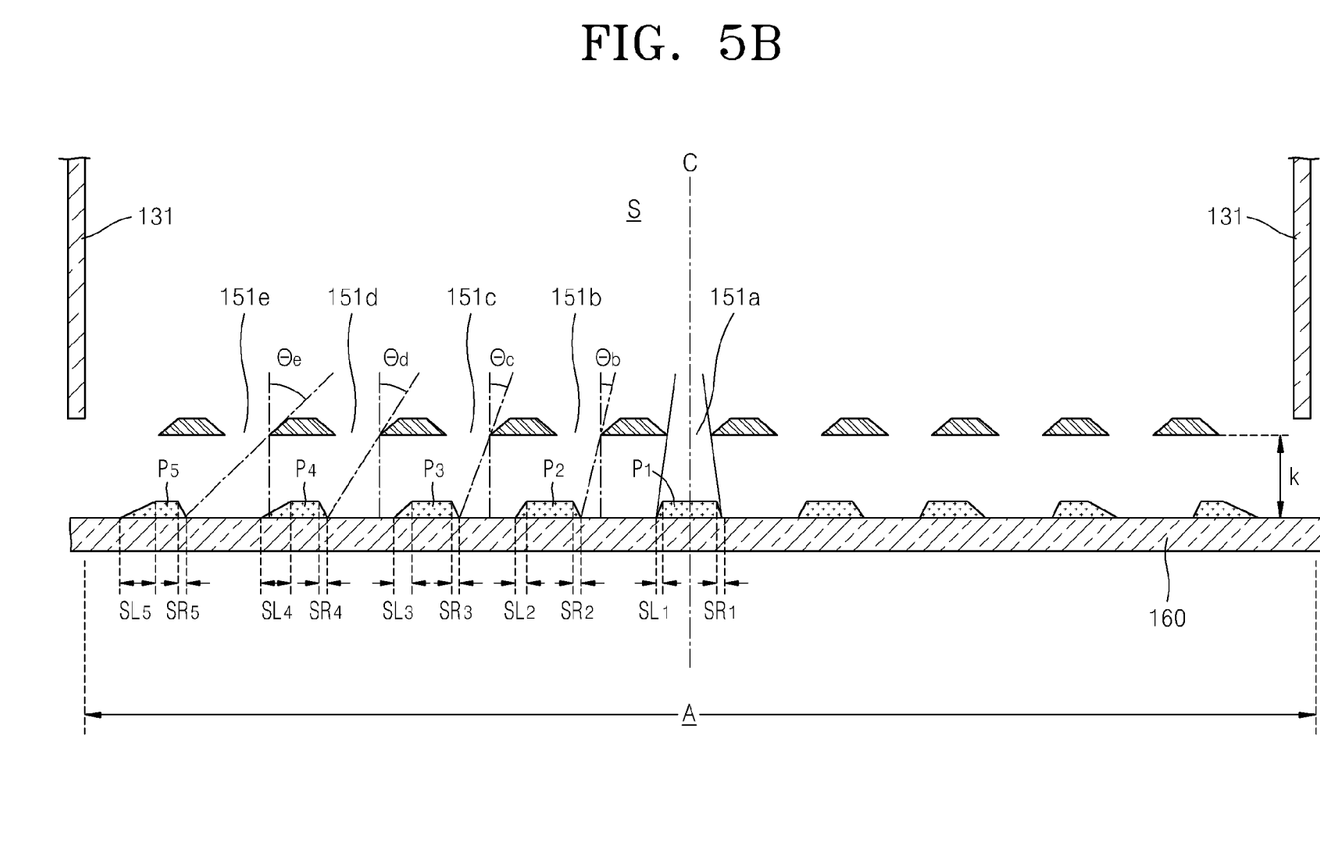
FIG. 5B illustrates a deposition material passing through the second nozzle forming organic layers on the substrate.

FIG. 5A illustrates that the second slits 151 of the second nozzle 150 in the thin film deposition apparatus 100 are arranged at equal intervals, and FIG. 5B illustrates that the deposition material passes through the second nozzle 150 of FIG. 5A forming organic layers on the substrate 160. Herein, FIGS. 5A and 5B illustrate a part of the second nozzle 150 disposed between two adjacent barrier walls 131, i.e., only second slits 151 within one sub-deposition space S.

In addition, the substrate 160 may be divided into a plurality of sub-deposition areas A by the barrier walls 131. In other words, a region of the substrate 160 between two adjacent barrier walls 131 constitutes a sub-deposition area A.

FIGS. 5A and 5B illustrate the second nozzle 150 including the second slits 151 arranged at equal intervals. That is, in FIG. 5A, the relation of $I_1=I_2=I_3=I_4$ is established.

In this case, the deposition material 115 that passes along a center line C of the sub-deposition space S has an incident angle substantially perpendicular to the substrate 160. Thus, an organic layer $P_1$ formed of the deposition material 115 that has passed through a second slit 151a may have the smallest entire shadow zone including a right-side shadow zone $SR_1$ and a left-side shadow zone $SL_1$ that are symmetrical to each other.

However, the deposition material 115 passing through a second slit further away from the center line C of the sub-deposition space S may have a greater critical incident angle θ, and thus the deposition material 115 that passes through a second slit 151e disposed in an end region of the second nozzle 150 may have a critical incident angle θ of about 55°. Thus, the deposition material 115 enters the second slit 151e slanting at an angle, and thus forms an organic layer $P_5$ by passing through the second slit 151e, wherein the organic layer $P_5$ has the largest entire shadow zone in which a left-side shadow zone $SL_5$ is wider than a right-side shadow zone $SR_5$.

In other words, the greater the critical incident angle θ of the deposition material 115, the larger the entire shadow zone of an organic layer, and in particular, the larger a side shadow zone of the organic layer further away from the center line C of the sub-deposition space S. In addition, the critical incident angle θ of the deposition material 115 becomes greater the further the distance from the center line C of the sub-deposition space S to the corresponding second slit. Thus, the further the distance from the center line C of the sub-deposition space S to a second slit, the larger the entire shadow zone of an organic layer formed of the deposition material 115 that has passed through the second slit, and the larger a side shadow zone of the organic layer further away from the center line C of the sub-deposition space S than the other side shadow zone thereof.

In other words, referring to FIG. 5B, for organic layers formed on the left from the center line C of the sub-deposition space S, left-inclined sides thereof are wider than right-inclined sides thereof. On the contrary, for organic layers formed on the right from the center line C of the sub-deposition space S, right-inclined sides thereof are wider than left-inclined sides thereof.

In addition, among the organic layers formed on the left from the center line C of the sub-deposition space S, organic layers lying further left from the center line C have wider left-inclined sides than right-inclined sides compared to the other organic layers. Similarly, among the organic layers formed on the right from the center line C of the sub-deposition space S, organic layers lying further to the right from the center line C have wider right-inclined sides than left-inclined sides compared to the other organic layers. Consequently, the organic layers formed in the sub-deposition space S are symmetrical with respect to the center line C of the sub-deposition space S.

This will now be described in detail below.

The deposition material passing through a second slit 151b at a critical incident angle $θ_b$ forms an organic layer $P_2$ including a left-side shadow zone having a width of $SL_2$. Similarly, the deposition material passing through a second slit 151c at a critical incident angle $θ_c$ forms an organic layer $P_3$ including a left-side shadow zone having a width of $SL_3$. Similarly, the deposition material passing through a second slit 151d at a critical incident angle $θ_d$ forms an organic layer $P_4$ including a left-side shadow zone having a width of $SL_4$. Finally, the deposition material passing through a second slit 151e at a critical incident angle $θ_e$ forms an organic layer $P_5$ including a left-side shadow zone having a width of $SL_5$.

Herein, the relation of $θ_b<θ_c<θ_d<θ_e$ is established, and thus the relation of $SL_1<SL_2<SL_3<SL_4<SL_5$, which defines the relation between the widths of the left-side shadow zones of the organic layers formed of the deposition material that has passed through the second slits 151, is also satisfied.

In addition, the substrate 160 may include a plurality of sub-deposition areas A parallel to each other. Although only one deposition area A is illustrated in FIG. 5B, when a plurality of such deposition areas A are continuously disposed, a pattern of organic layers may be regularly repeated. In other words, such a repetitive pattern may be constituted of organic layers whose left-side shadow zones become gradually narrower from a left end organic layer toward the right direction, wherein the left-side shadow zone of the left end organic layer is wider than a right-side shadow zone thereof; a middle organic layer, such as the organic layer $P_1$ of FIG. 5B, including a left-side shadow zone and a right-side shadow zone that have an equal width; and organic layers whose right-side shadow zones become gradually wider from the middle organic layer toward the right direction.

Figure 6:
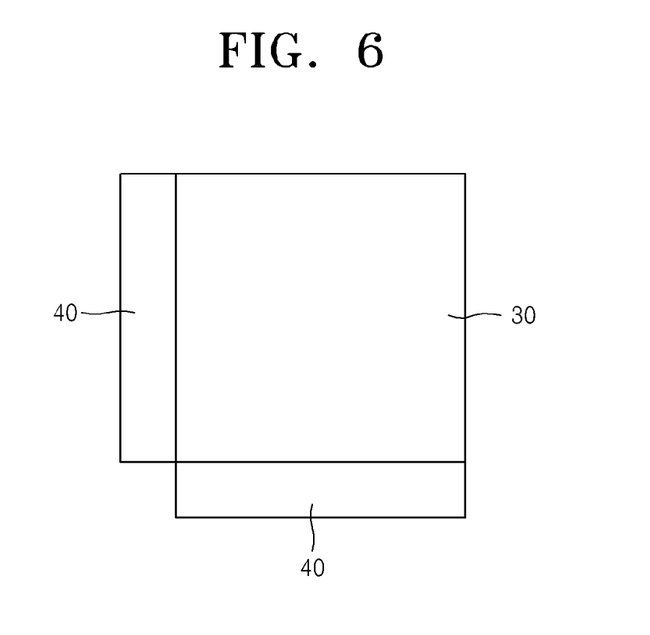
FIG. 6 is a plan view of an organic light-emitting display device according to an embodiment of the present invention.

FIG. 6 is a plan view of an organic light-emitting display device manufactured by using a thin film deposition apparatus, according to an embodiment of the present invention.

Referring to FIG. 6, the organic light-emitting display device includes a pixel region 30 and circuit regions 40 disposed at edges of the pixel region 30. The pixel region 30 includes a plurality of pixels, and each of the pixels includes an emission unit that emits light to display an image.

In an embodiment of the present invention, the emission unit may include a plurality of sub-pixels, each of which includes an organic light-emitting diode (OLED). In a full-color organic light-emitting display device, red (R), green (G) and blue (B) sub-pixels are arranged in various patterns, for example, in a line, mosaic, or lattice pattern, to constitute a pixel. The organic light-emitting display device according to an embodiment of the present invention may include a monochromatic flat display device.

The circuit regions 40 control, for example, an image signal that is input to the pixel region 30.

In the organic light-emitting display device, at least one thin film transistor (TFT) may be installed in each of the pixel region 30 and the circuit region 40.

The at least one TFT installed in the pixel region 30 may include a pixel TFT, such as a switching TFT that transmits a data signal to an OLED according to a gate line signal to control the operation of the OLED, and a driving TFT that drives the OLED by supplying current according to the data signal. The at least one TFT installed in the circuit region 40 may include a circuit TFT constituted to implement a predetermined circuit.

The number and arrangement of TFTs may vary according to the features of the display device and the driving method thereof.

Figure 7:
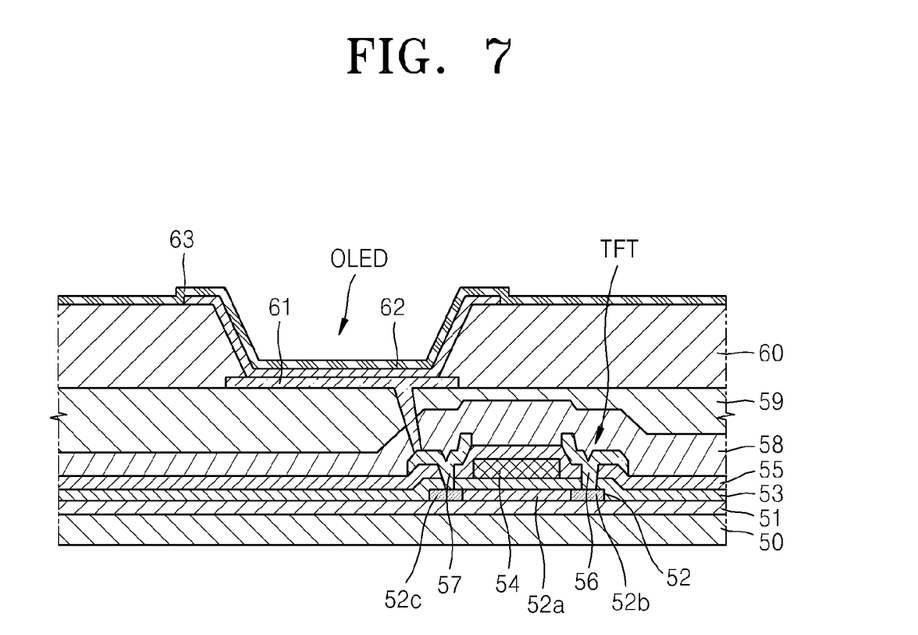
FIG. 7 is a sectional view of a sub-pixel of the organic light-emitting display device illustrated in FIG. 6, according to an embodiment of the present invention.

FIG. 7 is a sectional view of a sub-pixel of the organic light-emitting display device illustrated in FIG. 6, according to an embodiment of the present invention;

Referring to FIG. 7, a buffer layer 51 is formed on a substrate 50 formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52b and 52c, respectively, of the active layer 52 through contact holes. A gate region 52c is disposed between the source/drain regions 52b and 52c. A passivation layer 58 is formed of $SiO_2$, $SiN_x$, or the like on the source/drain electrodes 56 and 57. A planarization layer 59 is formed of an organic material, such as acryl, polyimide, benzocyclobutene (BCB), or the like, on the passivation layer 58. A pixel electrode 61, which functions as an anode of the OLED, is formed on the planarization layer 59, and a pixel defining layer 60 formed of an organic material is formed to cover the pixel electrode 61. An opening is formed in the pixel defining layer 60, and an organic layer 62 is formed on a surface of the pixel defining layer 60 and on a surface of the pixel electrode 61 exposed through the opening. The organic layer 62 includes an emission layer. The present invention is not limited to the structure of the organic light-emitting display device described above, and various structures of organic light-emitting display devices may be applied to the embodiments of the present invention.

The OLED displays predetermined image information by emitting red, green and blue light as current flows. The OLED includes the pixel electrode 61, which is connected to the drain electrode 56 of the TFT and to which a positive power voltage is applied, a counter electrode 63, which is formed so as to cover the entire sub-pixel and to which a negative power voltage is applied, and the organic layer 62, which is disposed between the pixel electrode 61 and the counter electrode 63 to emit light.

The pixel electrode 61 and the counter electrode 63 are insulated from each other by the organic layer 62, and respectively apply voltages of opposite polarities to the organic layer 62 to induce light emission in the organic layer 62.

The organic layer 62 may include a low-molecular weight organic layer or a high-molecular weight organic layer. When a low-molecular weight organic layer is used as the organic layer 62, the organic layer 62 may have a single or multi-layer structure including at least one selected from the group consisting of a hole injection layer (HIL), a hole transport layer (HTL), an emission layer (EML), an electron transport layer (ETL), an electron injection layer (EIL), and the like. Examples of available organic materials include copper phthalocyanine (CuPc), N,N'-di(naphthalene-1-yl)-N,N'-diphenyl-benzidine (NPB), tris-8-hydroxyquinoline aluminum ($Alq_3$), and the like. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The pixel electrode 61 functions as an anode, and the counter electrode 63 functions as a cathode. Alternatively, the pixel electrode 61 may function as a cathode, and the counter electrode 63 may function as an anode.

The pixel electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

The counter electrode 63 may be formed as a transparent electrode or a reflective electrode. When the counter electrode 63 is formed as a transparent electrode, the counter electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, $In_2O_3$, or the like. When the counter electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display apparatus described above, the organic layer 62 may be formed using the thin film deposition assembly 100 described above with reference to FIGS. 1 through 5. In other words, the substrate 50 may be divided into a plurality of deposition areas (refer to "A" in FIG. 5B) by the barrier wall assembly 130 illustrated in FIG. 1. An organic layer formed of the deposition material that has passed through a second slit further away from the center line C of the sub-deposition space S has a larger shadow zone, and in particular, a side shadow zone of the organic layer further away from the center line C of the sub-deposition space S is larger than the other side shadow zone of the organic layer.

In other words, referring to FIG. 5B, for the organic layers formed on the left from the center line C of the sub-deposition space S, the left-inclined sides thereof are wider than the right-inclined sides thereof. On the contrary, for the organic layers formed on the right from the center line C of the sub-deposition space S, the right-inclined sides thereof are wider than the left-inclined sides thereof.

In addition, among the organic layers formed on the left from the center line C of the sub-deposition space S, organic layers lying further left from the center line C have wider left-inclined sides than right-inclined sides compared to the other organic layers. Similarly, among the organic layers formed on the right from the center line C of the sub-deposition space S, organic layers lying further right from the center line C have wider right-inclined slides than left-inclined sides compared to the other organic layers. Consequently, the organic layers formed in the deposition area A are symmetrical with respect to the center line C of the sub-deposition space S. The shape of such a pattern of organic layers have been described in detail with reference to FIG. 5B, and thus a detailed description thereof will not be provided here.

Figure 8:
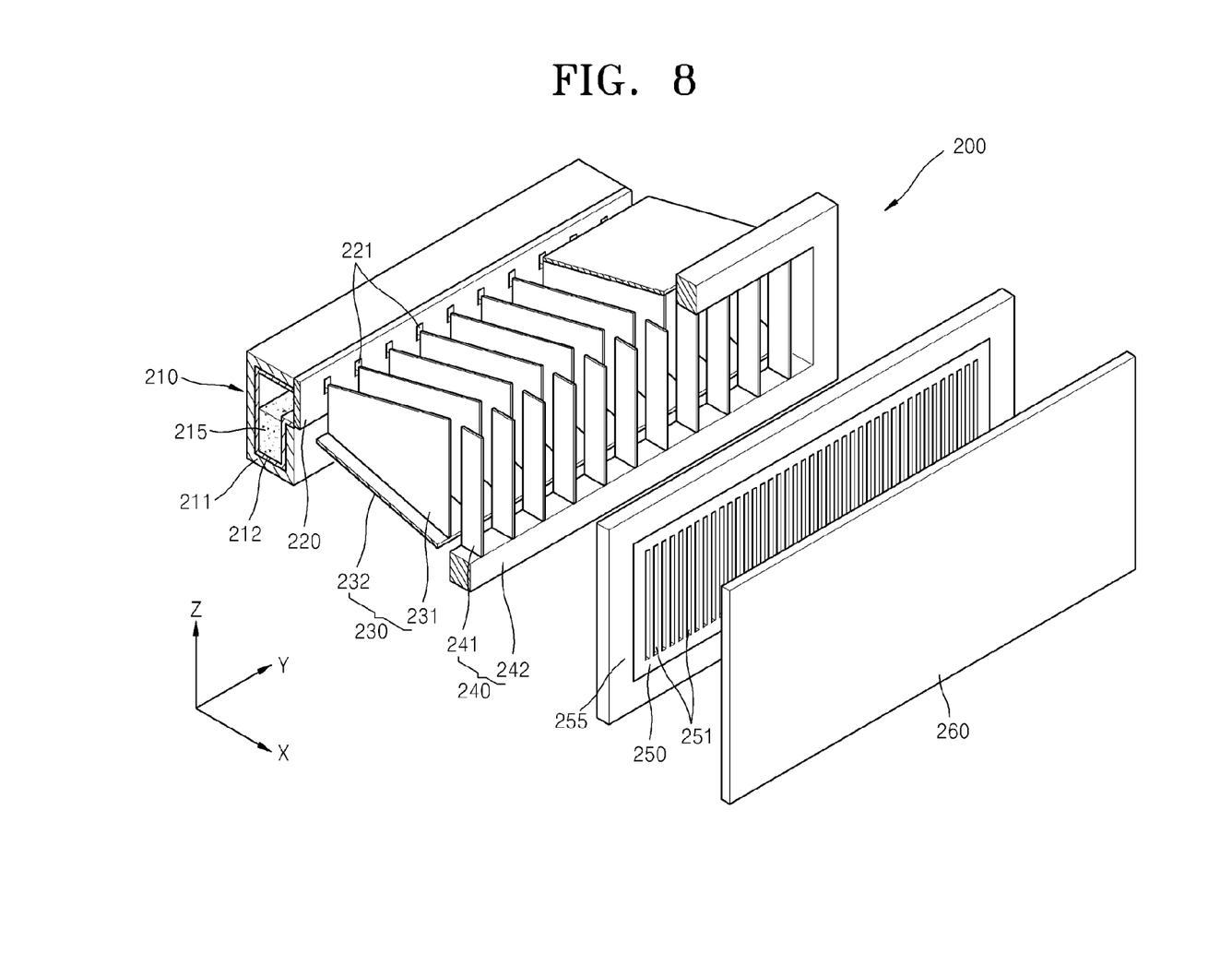
FIG. 8 is a schematic perspective view of a thin film deposition apparatus according to another embodiment of the present invention.

FIG. 8 is a schematic perspective view of a thin film deposition apparatus 200 according to another embodiment of the present invention.

Referring to FIG. 8, the thin film deposition apparatus 200 includes a deposition source 210, a first nozzle 220, a first barrier wall assembly 230, a second barrier wall assembly 240, a second nozzle 250, a second nozzle frame 255, and a substrate 260.

Although a chamber is not illustrated in FIG. 8 for convenience of explanation, all the components of the thin film deposition assembly 200 may be disposed within a chamber that is maintained at an appropriate degree of vacuum. The chamber is maintained at an appropriate vacuum in order to allow a deposition material to move in a straight direction.

The substrate 260, which constitutes a target on which a deposition material 215 is to be deposited, is disposed in the chamber. The deposition source 210 that contains and heats the deposition material 215 is disposed in an opposite side of the chamber to that in which the substrate 260 is disposed. The deposition source 210 may include a crucible 211 and a heater 212.

The first nozzle 220 is disposed at a side of the deposition source 210, and in particular, at the side of the deposition source 210 facing the substrate 260. The first nozzle 220 includes a plurality of first slits 221 arranged at equal intervals in a Y-axis direction.

The first barrier wall assembly 230 is disposed at a side of the first nozzle 220. The first barrier wall assembly 230 includes a plurality of first barrier walls 231, and a first barrier wall frame 232 that covers sides of the first barrier walls 231.

The second barrier wall assembly 240 is disposed at a side of the first barrier wall assembly 230. The second barrier wall assembly 240 includes a plurality of second barrier walls 241, and a second barrier wall frame 242 that covers sides of the second barrier walls 241.

The second nozzle 250 and the second nozzle frame 255 are disposed between the deposition source 210 and the substrate 260. The second nozzle frame 255 may be formed in a lattice shape, similar to a window frame. The second nozzle 250 is bound inside the second nozzle frame 255. The second nozzle 250 includes a plurality of second slits 251 arranged at equal intervals in the Y-axis direction.

The thin film deposition assembly 200 includes two separate barrier wall assemblies, i.e., the first barrier wall assembly 230 and the second barrier wall assembly 240, unlike the thin film deposition assembly 100 illustrated in FIG. 1, which includes one barrier plate assembly 130.

The plurality of first barrier walls 231 may be arranged parallel to each other at equal intervals in the Y-axis direction. In addition, each of the first barrier walls 231 may be formed to extend along an XZ plane in FIG. 8, i.e., perpendicular to the Y-axis direction.

The plurality of second barrier walls 241 may be arranged parallel to each other at equal intervals in the Y-axis direction. In addition, each of the second barrier walls 241 may be formed to extend along an XZ plane in FIG. 8, i.e., perpendicular to the Y-axis direction.

The plurality of first barrier walls 231 and the plurality of second barrier walls 241, arranged as described above, partition the space between the first nozzle 220 and the second nozzle 250. In the thin film deposition apparatus 200, the deposition space is divided by the first barrier walls 231 and the second barrier walls 241 into sub-deposition spaces that respectively correspond to the first slits 221 through which the deposition material 215 is discharged.

The second barrier walls 241 may be disposed to correspond respectively to the first barrier walls 231. In other words, the second barrier walls 241 may be respectively disposed to be parallel to and to be on the same plane as the first barrier walls 231. Each pair of the corresponding first and second barrier walls 231 and 241 may be located on the same plane. As described above, since the space between the first nozzle 220 and the second nozzle 250, which will be described later, is partitioned by the first barrier walls 231 and the second barrier walls 241, which are disposed parallel to each other, the deposition material 215 discharged through each of the first slits 221 is not mixed with the deposition material 215 discharged through the other first slits 221, and is deposited on the substrate 260 through the second slits 251. In other words, the first barrier walls 231 and the second barrier walls 241 guide the deposition material 215, which is discharged through the first slits 221, not to flow in the Y-axis direction.

Although the first barrier walls 231 and the second barrier walls 241 are respectively illustrated as having the same thickness in the Y-axis direction, the present invention is not limited thereto. In other words, the second barrier walls 241, which need to be accurately aligned with the second nozzle 250, may be formed to be relatively thin, whereas the first barrier walls 231, which do not need to be precisely aligned with the second nozzle 250, may be formed to be relatively thick. This makes it easier to manufacture the thin film deposition apparatus 200.

In addition, regarding organic layers formed using the thin film deposition apparatus 200 according to the embodiment described with reference to FIG. 8, as illustrated in FIG. 5B, the further the distance from the center line C of the sub-deposition space S to a second slit, the larger the entire shadow zone in an organic layer formed of the deposition material that has passed through the second slit, and the larger a side shadow zone of the organic layer further away from the center line C of the sub-deposition space S than the other side shadow zone thereof.

In other words, for organic layers formed on the left from the center line C of the sub-deposition space S, left-inclined sides thereof are wider than right-inclined sides thereof. On the other hand, for organic layers formed on the right from the center line C of the sub-deposition space S, right-inclined sides thereof are wider than left-inclined sides thereof. In addition, among the organic layers formed on the left from the center line C of the sub-deposition space S, organic layers lying further left from the center line C have wider left-inclined sides than right-inclined sides compared to the other organic layers. Similarly, among the organic layers formed on the right from the center line C of the sub-deposition space S, organic layers lying further right from the center line C have wider right-inclined slides than left-inclined ones compared to the other organic layers. Consequently, the organic layers formed in the sub-deposition space S are symmetrical with respect to the center line C of the sub-deposition space S. The shape of such a pattern of organic layers have been described in detail in the above embodiment with reference to FIG. 5B, and thus a detailed description thereof will not be provided here.

As described above, in a thin film deposition apparatus according to an embodiment of the present invention and a method of manufacturing an organic light-emitting display device according to an embodiment of the present invention by using the thin film deposition apparatus, the thin film deposition apparatus may be simply applied to manufacture large substrates on a mass scale. In addition, the thin film deposition apparatus and the organic-light-emitting display device may be easily manufactured, may improve manufacturing yield and deposition efficiency, and may allow deposition materials to be reused.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting display device comprising:
   a substrate including a plurality of deposition areas that are parallel to each other;
   at least one thin film transistor formed in each of the plurality of deposition areas on the substrate, the at least one thin film transistor comprising a semiconductor active layer, a gate electrode insulated from the semiconductor active layer, and source and drain electrodes contacting the semiconductor active layer;
   a plurality of pixel electrodes formed on the at least one thin film transistor;
   a plurality of organic layers formed on the pixel electrodes, each of the organic layers comprising a shadow zone; and
   a counter electrode formed on the organic layers,
   wherein a size of the shadow zone of each of the organic layers increases as a distance from a center of a corresponding one of the deposition areas to the organic layer increases, and
   wherein one of the plurality of organic layers formed on the substrate at the center of the corresponding one of the deposition areas has the smallest shadow zone among the organic layers in the corresponding deposition area.

2. The organic light-emitting display device of claim 1, wherein the shadow zone of each of the organic layers comprises a left-side shadow zone and a right-side shadow zone, and whichever of the left-side shadow zone and the right-side shadow zone is further away from the center of the corresponding one of the deposition areas is larger with respect to the other shadow zone.

3. The organic light-emitting display device of claim 1, wherein the shadow zone of each of the organic layers comprises a left-side shadow zone and a right-side shadow zone, and the larger of the left-side shadow zone and the right-side shadow zone of each of the organic layers formed on the substrate is further away from the center of the corresponding one of the deposition areas.

4. The organic light-emitting display device of claim 1, wherein the shadow zone of one of the plurality of organic layers formed on the substrate at the center of the corresponding one of the deposition areas comprises a left-side shadow zone and a right-side shadow zone of substantially a same size.

5. The organic light-emitting display device of claim 1, wherein the plurality of organic layers in each of the deposition areas are symmetrical with respect to the center of the corresponding deposition area.

6. The organic light-emitting display device of claim 1, wherein the plurality of organic layers formed in each of the deposition areas have a same pattern.

* * * * *